(12) United States Patent
Chin

(10) Patent No.: US 6,525,464 B1
(45) Date of Patent: Feb. 25, 2003

(54) STACKED LIGHT-MIXING LED

(75) Inventor: Yuan-Cheng Chin, Hsintien (TW)

(73) Assignee: Unity Opto Technology Co., Ltd., Taipei Hsien (TW)

( * ) Notice: Subject to any disclaimer, the term of this patent is extended or adjusted under 35 U.S.C. 154(b) by 43 days.

(21) Appl. No.: 09/657,574

(22) Filed: Sep. 8, 2000

(51) Int. Cl.[7] .................................................. H01J 1/62
(52) U.S. Cl. ........................................ 313/499; 313/512
(58) Field of Search .............................. 313/499, 500, 313/502, 503, 512

(56) References Cited

U.S. PATENT DOCUMENTS

| | | | | | |
|---|---|---|---|---|---|
| 5,393,993 | A | * | 2/1995 | Edmond et al. | 257/77 |
| 5,623,181 | A | * | 4/1997 | Suehiro et al. | 313/512 |
| 5,707,745 | A | * | 1/1998 | Forrest et al. | 428/432 |
| 5,998,925 | A | * | 12/1999 | Shimizu et al. | 313/503 |
| 6,346,771 | B1 | * | 2/2002 | Salam | 313/499 |
| 2001/0022495 | A1 | * | 9/2001 | Salam | 313/499 |
| 2002/0057567 | A1 | * | 5/2002 | Chen | 362/245 |

FOREIGN PATENT DOCUMENTS

JP          106555    *  5/1998    ......... H01L/21/205

* cited by examiner

Primary Examiner—Ashok Patel
(74) Attorney, Agent, or Firm—Bacon & Thomas

(57) ABSTRACT

A stacked light-mixing LED includes a main body, more than one connecting parts, a first chip, and a second chip. Two lights with different wavelength in the visible light spectrum area, such as the yellow light and the blue light, or the green light and the red light, are respectively excited and emitted from the first chip and the second chip. By controlling electrical current and voltage, the two lights respectively excited from the first chip and the second chip can be symmetrically mixed into another wavelength of light in the visible light spectrum area, such white light.

17 Claims, 6 Drawing Sheets

STACKED LIGHT-MIXING LED

BACKGROUND OF THE INVENTION

1. Field of the Invention

The present invention relates to an LED and, more particularly, to an LED that provides better light-mixing effect by stacking chips.

2. Description of Related Art

A conventional LED utilizes blue light to excite a fluorochrome material to cause the fluorochrome material to emit yellow light, which is mixed with the blue light to generate white light. Alternatively, the conventional LED utilizes a parallel blue chip and yellow chip (shown in FIG. 5 and FIG. 6) to emit the white light. The blue chip 93 and the yellow chip 94 are stuck on the conductive supporting frame 91 of the LED 9 by conductive paste 92, and the electrical power supplied by the conductive frame 91 is used to make the blue chip 93 emit the blue light and the yellow chip 94 to emit yellow light. By controlling the electrical current and voltage, the LED 9 with the characteristic of a single wavelength can make the blue light and yellow light diffuse and mix to provide white light.

However, the LED 9, which has the parallel chip 93 and chip 94, has a problem in mixing the lights, and also has a color fleck problem. The reason is that the distance D between the parallel chip 93 and chip 94 causes the LED to display different colors on two sides of the LED, the blue LED chip 93 side showing blue light and the yellow due to difficulties in processing that the distance D between the chip 93 and the chip 94 cannot be made closer or the chips will be short-circuited and leaking current problems will result, which causes the additional problem of decreasing the yield.

SUMMARY OF THE INVENTION

The main objective of the present invention is to solve the aforesaid problems and to provide a stacked, light-mixing LED in which by mixing two lights with different wavelengths in the visible light spectrum area, excited and emitted from a first chip and a second chip, and by controlling electrical current and voltage, the two lights excited from the first chip and the second chip can be mixed into another wavelength of light in the visible light spectrum area, such as the white light, to provide a better symmetric light-mixing effect and avoid a visible color difference.

Another objective of the present invention is to provide a stacked, light-mixing LED without the problem of short circuits and leaking current by stacking the first chip and the second chip.

Other advantages and features of the present invention will be better understood with reference to the following drawings and the detailed description thereof.

BRIEF DESCRIPTION TO THE DRAWINGS

DETAILED DESCRIPTION OF THE INVENTION

Figure 1:
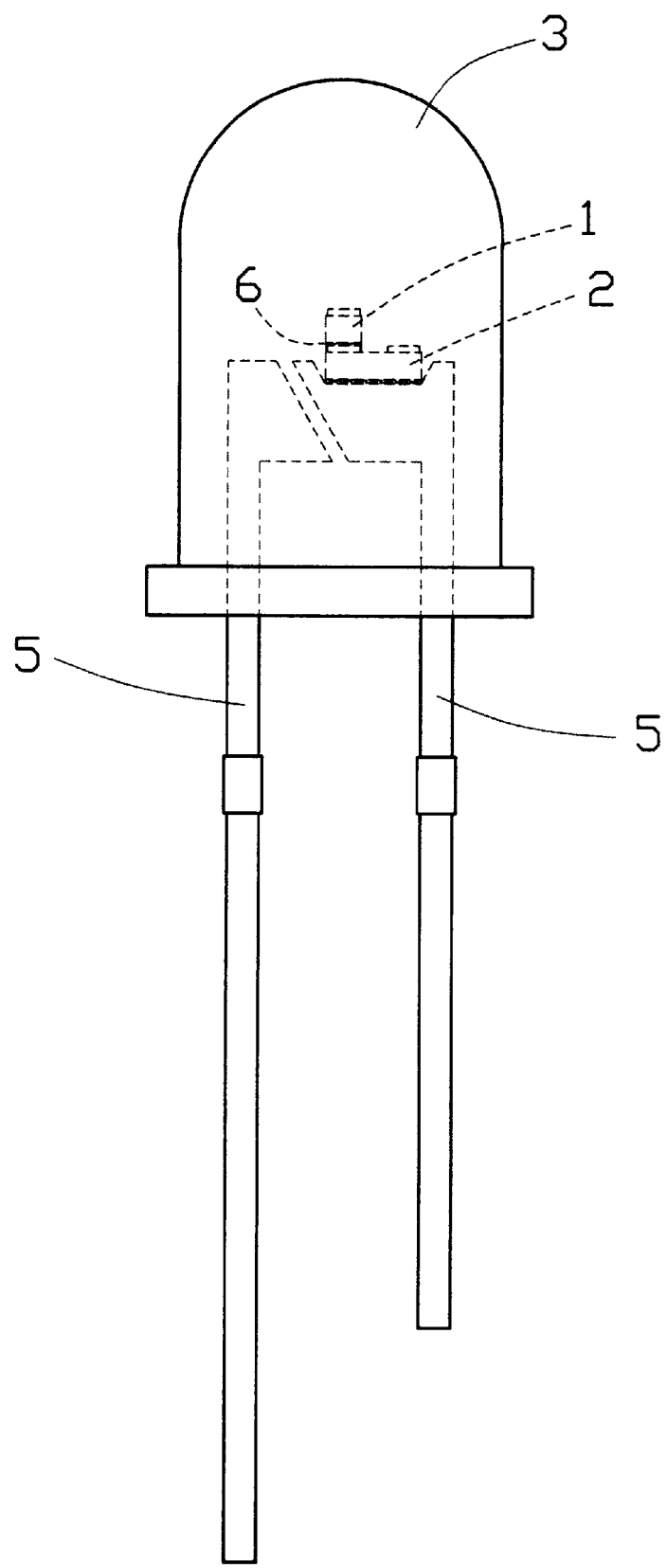
FIG. 1 is a schematic view showing a first embodiment of the present invention.
Figure 2:
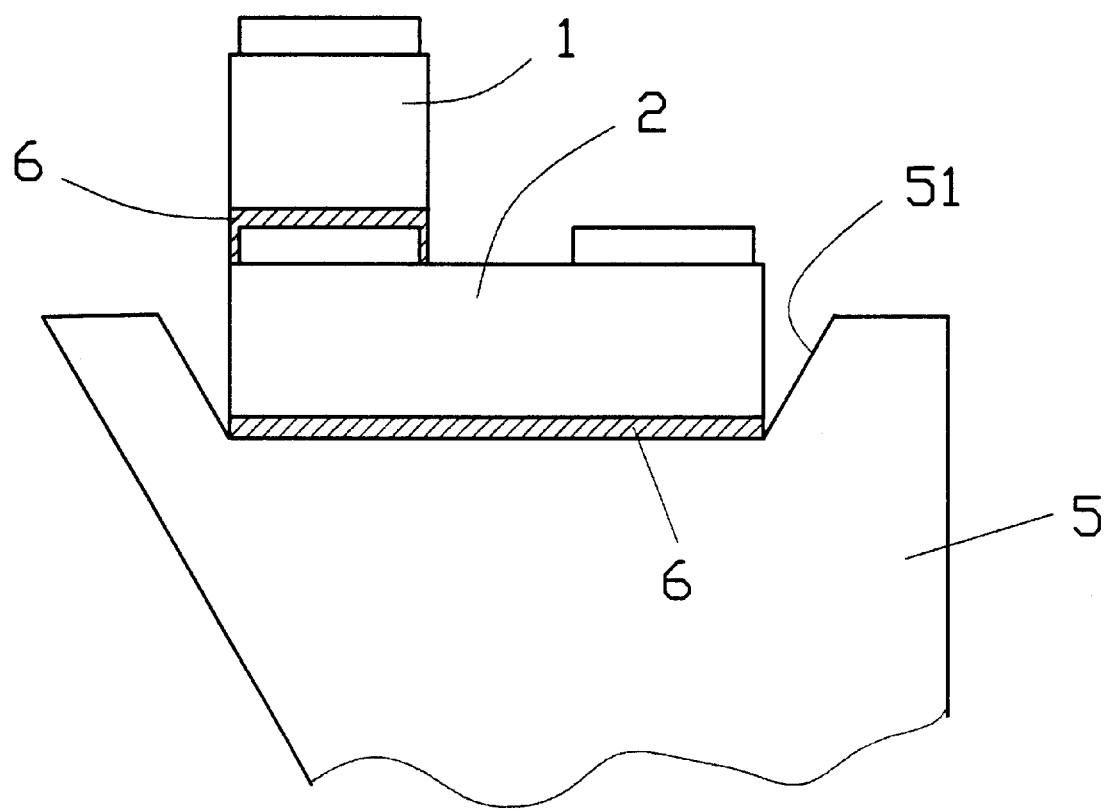
FIG. 2 is a locally detailed schematic view of FIG. 1.

Referring to FIG. 1 and FIG. 2, the stacked light-mixing LED of the first embodiment includes a translucent main body 3 which has a predetermined shape, and more than one electrically conductive connecting part 5 extending outwardly from the main body 3 to connect with an electrical power source (not shown), the connecting part having an adapted part 51 which takes the form of an indent in the first embodiment. A first chip 1 and a second chip 2 are located on the adapted part 51 of the connecting parts 5. The first chip 1 and the second chip 2 can be separately excited to emit lights of different wavelength. The first chip 1 is stacked on top of the second chip, and the contacting surface between the first chip and the second chip has an extrinsic semiconduction. In the first embodiment, the first chip 1 is a transparent type AlInGaN chip which can be excited to emit yellow light. The lights emitted by the first chip 1 and the second chip 2 are in the visible light spectrum area. The top and bottom of the first chip 1 are made of different materials with different extrinsic semiconduction. In the top of the first chip 1, the semiconduction is N-type, and in the bottom of the first chip 1, the semiconduction is P-type. The second chip 2 can be InGaN on a sapphire substrate, or InGaN on a SiC substrate, and can be excited to emit blue light. The second chip 2 is larger than the first chip 1, and the second chip 2 has different extrinsic semiconduction, with N-type and P-type semiconduction on the left side and the right side, respectively. The first chip 1 is stacked and stuck on the left side of the second chip 2 with a conductive material such as the conductive paste 6.

The present invention causes the first chip 1 and the second chip 2 to be excited and emit lights with different wavelengths controlled by the electrical current and voltage, the lights then being mixed into the white light. The reason is that there is no distance between the chips that would cause color difference effects, since the first chip 1 is stacked directly on the second chip 2 to avoid the problem of different light emitted from different sides of the LED to provide better, more symmetric light mixing effects.

In other words, the present invention stacks the first chip 1 and the second chip 2 rather than arranging them in parallel to provide better symmetric mixing and to reduce the distance between the first chip 1 and the second chip 2 without having the problem of short circuits and leaking current, thereby raising the effective production yield rate.

Figure 3:
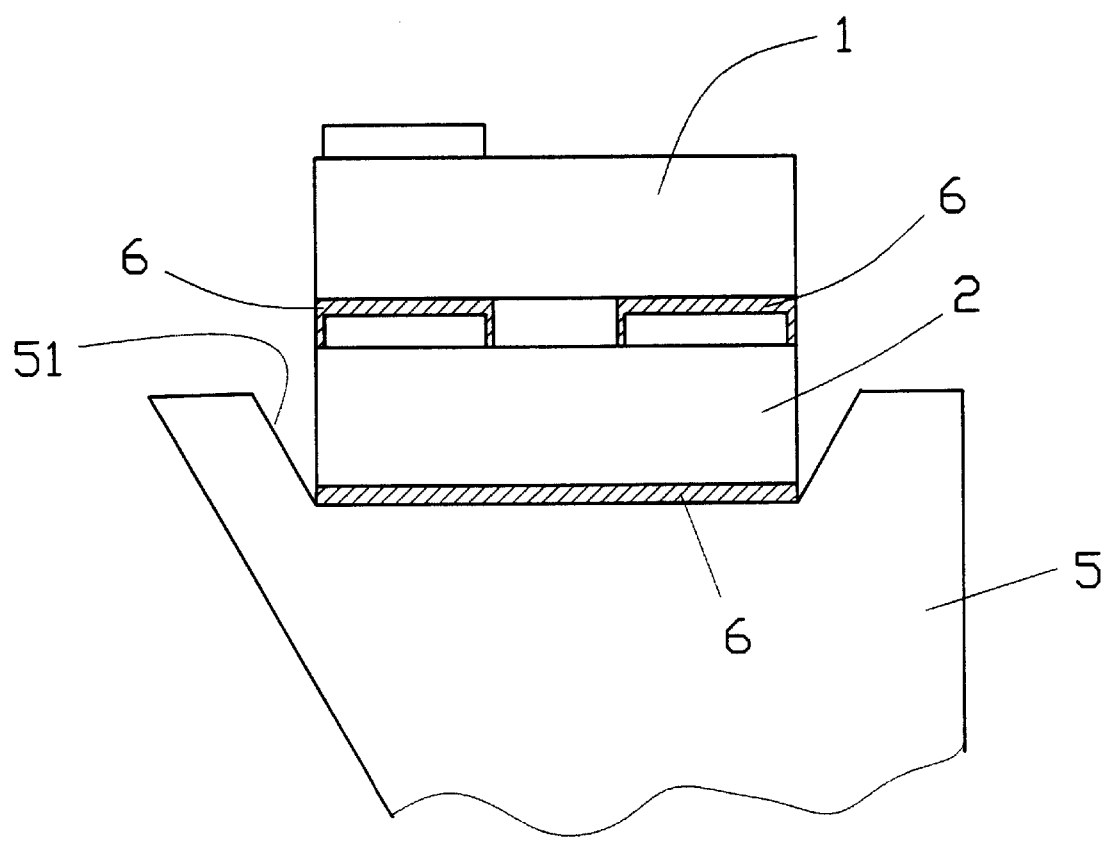
FIG. 3 is a schematic view showing a second embodiment of the present invention.
Figure 4:
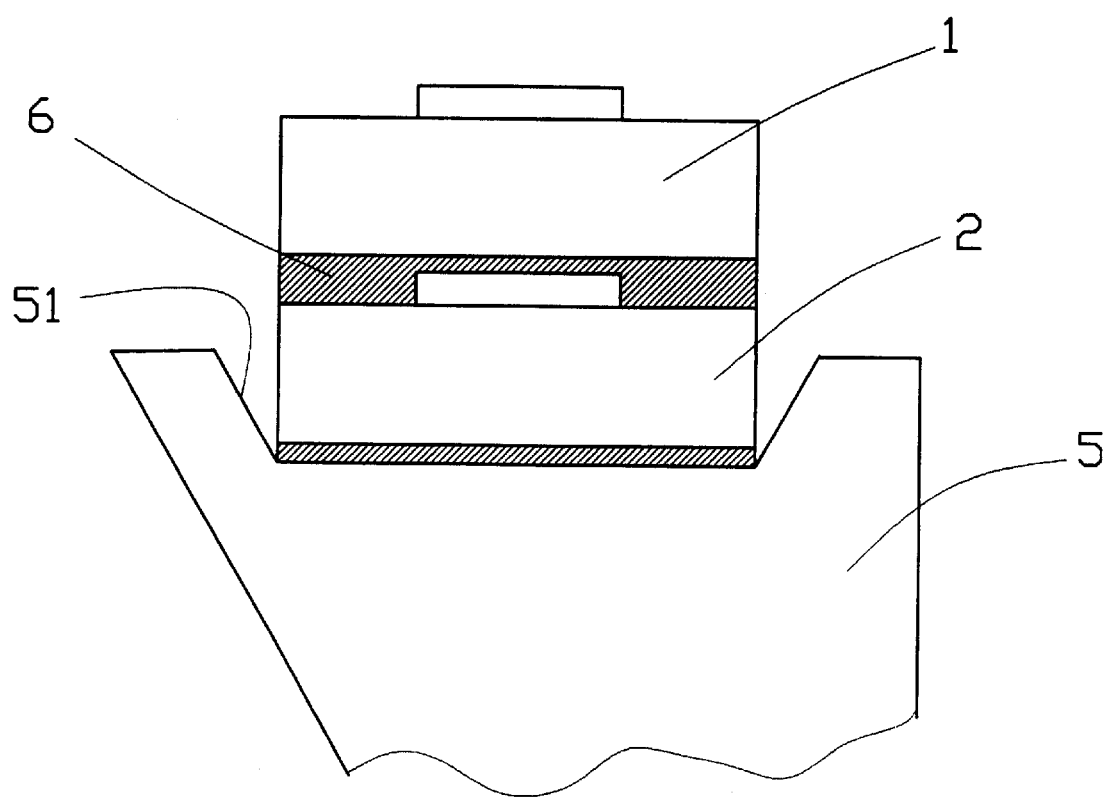
FIG. 4 is a schematic view showing the third embodiment of the present invention.
Figure 5:
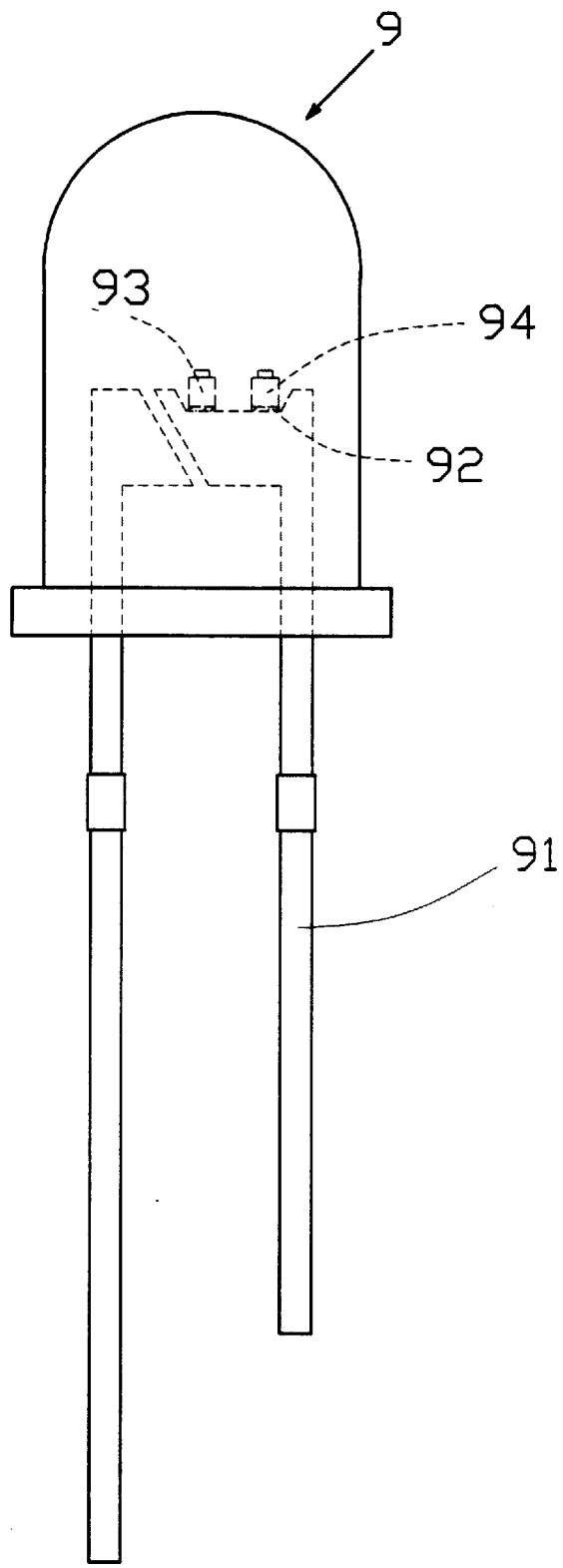
FIG. 5 is a schematic view showing a conventional LED.
Figure 6:
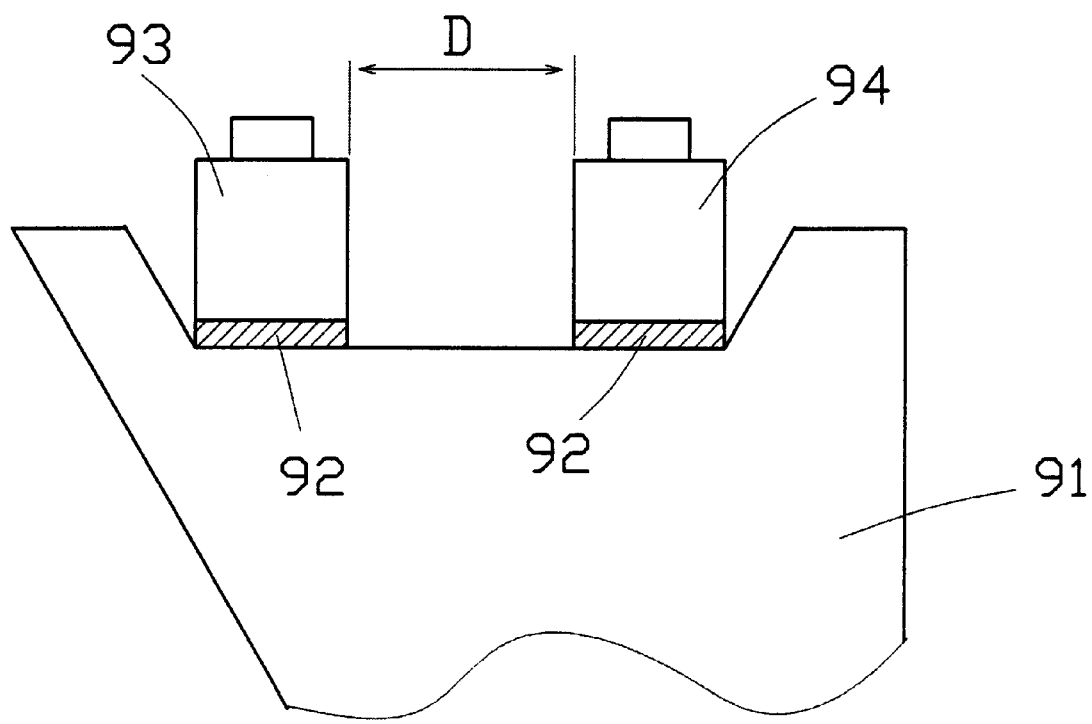
FIG. 6 is a locally detailed schematic view of FIG. 5.

Meanwhile, the present invention is not limited by the aforesaid embodiment, as shown in FIGS. 3 and 4, in which the second embodiment and the third embodiment of the present invention are illustrated. In both embodiments, the size of the first chip 1 and the size of the second chip 2 are almost the same. In the top of the first chip 1 and the second chip 2, and in the bottom of the first chip 1 and the second chip 2 are different extrinsic semiconduction, and the first chip 1 and the second chip 2 are stacked and shtuck to each other to have the advantage of symmetric light mixing. In addition, the first chip 1 and the second chip 2 can be switched with each other. The first chip 1 can again be InGaN on a sapphire substrate, InGaN on an SiC substrate, or some other material. The second chip 2 can be a transparent AlInGaN chip or other materials. Furthermore, lights emitted from the aforesaid first chip 1 and second chip 2 can have different wavelengths, such as the green light and red light, and can be mixed into other light.

The present invention causes the first chip 1 and the second chip 2 of these embodiments to be excited to emit lights with different wavelengths controlled by the electrical current and voltage. Because the first chip 1 is stacked on the second chip 2, the symmetric effect of light mixing is better and the production rate is increased without the short-circuited and leaking current problem.

The present invention has been described hitherto with exemplary preferred embodiments. However, it is to be understood that the scope of the present invention need not be limited to the disclosed preferred embodiments. On the contrary, it is intended to cover various modifications and similar arrangements with the scope defined in the following appended claims. The scope of the claims should be accorded the broadest interpretation so as to encompass all such modifications and similar arrangements.

What is claimed is:

1. A stacked light-mixing LED comprising:

a main body which is transparent and has a fixed shape;

more than one electrically conductive connecting part extending outwardly from the main body to connect the main body with an electrical power source, wherein said main body includes an adapted portion adapted to receive a first chip and a second chip, said first and second chips being arranged to be excited to emit lights, wherein the first chip is stacked on the second chip and opposite extrinsic semiconductor layers of the first and second chips are adjacent each other, and wherein the first chip and the second chip are stuck together by conductive paste.

2. The stacked light-mixing LED of claim 1 wherein the connecting parts are two supporting parts, and one of the two supporting parts has an indent which forms said adapted portion.

3. The stacked light-mixing LED of claim 1 wherein the first chip is a transparent InGaN chip.

4. The stacked light-mixing LED of claim 1 wherein the first chip comprises different type semiconductors.

5. The stacked light-mixing LED of claim 1 wherein the second chip comprises InGaN on a sapphire substrate.

6. The stacked light-mixing LED of claim 1 wherein the second chip comprises InGaN on an SiC substrate.

7. The stacked light-mixing LED of claim 1 wherein the second chip comprise different type semiconductors.

8. The stacked light-mixing LED of claim 1 wherein the first chip comprises InGaN on a sapphire substrate.

9. The stacked light-mixing LED of claim 1 wherein the first chip comprises InGaN on an SiC substrate.

10. The stacked light-mixing LED of claim 1 wherein the second chip is larger than the first chip and the first chip is stacked on one side of the second chip.

11. The stacked light-mixing LED of claim 1 wherein the size of the first chip and the size of the second chip are almost the same.

12. The stacked light-mixing LED of claim 1 wherein the second chip is a transparent InGaN chip.

13. A stacked light-mixing LED comprising:

a first chip and a second chip connected to an electrical power source and arranged to be excited to emit lights of different wavelength;

wherein the first chip is stacked on the second chip and opposite extrinsic semiconductor layers of the first and second chips are adjacent each other, and wherein the first chip and the second chip are stuck together by conductive paste.

14. The stacked light-mixing LED of claim 13 wherein the first chip is a transparent InGaN chip.

15. The stacked light-mixing LED of claim 13 wherein the first chip comprises different type semiconductors.

16. The stacked light-mixing LED of claim 13 wherein the second chip comprises InGaN on a sapphire substrate.

17. The stacked light-mixing LED of claim 13 wherein the second chip comprises InGaN on an SiC substrate.

* * * * *